(12) United States Patent
Huang et al.

(10) Patent No.: US 11,417,685 B2
(45) Date of Patent: Aug. 16, 2022

(54) FIN TRANSISTOR STRUCTURE AND FABRICATION METHOD THEREOF

(71) Applicant: United Microelectronics Corp., Hsinchu (TW)

(72) Inventors: Sheng-Yao Huang, Kaohsiung (TW); Yu-Ruei Chen, New Taipei (TW); Chung-Liang Chu, Kaohsiung (TW); Zen-Jay Tsai, Tainan (TW); Yu-Hsiang Lin, New Taipei (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 224 days.

(21) Appl. No.: 16/699,474

(22) Filed: Nov. 29, 2019

(65) Prior Publication Data

US 2021/0104554 A1 Apr. 8, 2021

(30) Foreign Application Priority Data

Oct. 8, 2019 (CN) .......................... 201910948784.3

(51) Int. Cl.
*H01L 27/12* (2006.01)
*H01L 21/8234* (2006.01)
*H01L 29/66* (2006.01)
*H01L 29/78* (2006.01)

(52) U.S. Cl.
CPC .. *H01L 27/1211* (2013.01); *H01L 21/823431* (2013.01); *H01L 29/66795* (2013.01); *H01L 29/785* (2013.01)

(58) Field of Classification Search
CPC combination set(s) only.
See application file for complete search history.

(56) References Cited

U.S. PATENT DOCUMENTS

| | | | |
|---|---|---|---|
| 6,613,652 B2 | 9/2003 | Lim et al. | |
| 7,396,732 B2 | 7/2008 | Kunnen | |
| 8,637,384 B2 | 1/2014 | Ando et al. | |
| 8,912,602 B2 | 12/2014 | Hsu et al. | |
| 9,960,275 B1 | 5/2018 | Chang et al. | |
| 2005/0242395 A1 | 11/2005 | Chen et al. | |
| 2007/0134864 A1* | 6/2007 | Anderson | H01L 21/84 438/197 |
| 2007/0158764 A1 | 7/2007 | Orlowski et al. | |
| 2011/0084340 A1 | 4/2011 | Yuan et al. | |
| 2011/0193178 A1 | 8/2011 | Chang et al. | |

(Continued)

FOREIGN PATENT DOCUMENTS

| | | |
|---|---|---|
| WO | 2017052650 | 3/2017 |
| WO | 2019040071 | 2/2019 |

OTHER PUBLICATIONS

"Search Report of Europe Counterpart Application", dated Oct. 5, 2020, p. 1-p. 10.

*Primary Examiner* — Mark W Tornow
*Assistant Examiner* — Priya M Rampersaud
(74) *Attorney, Agent, or Firm* — J.C. Patents

(57) ABSTRACT

A fin transistor structure is provided. The fin transistor structure includes a first substrate. An insulation layer is disposed on the first substrate. A plurality of fin structures are disposed on the insulation layer. A supporting dielectric layer fixes the fin structures at the fin structures at waist parts thereof. A gate structure layer is disposed on the supporting dielectric layer and covers a portion of the fin structures.

8 Claims, 7 Drawing Sheets

(56) References Cited

U.S. PATENT DOCUMENTS

| | | |
|---|---|---|
| 2011/0198676 A1 | 8/2011 | Luo et al. |
| 2014/0246731 A1* | 9/2014 | Chen .................. H01L 29/0653 |
| | | 257/386 |
| 2017/0162697 A1 | 6/2017 | Zhu |
| 2017/0256456 A1* | 9/2017 | Lee .................... H01L 29/7848 |
| 2017/0338323 A1* | 11/2017 | Cheng ................. H01L 29/161 |
| 2018/0122800 A1* | 5/2018 | Cheng ................ H01L 29/7827 |
| 2019/0181220 A1 | 6/2019 | Cheng et al. |

* cited by examiner

FIN TRANSISTOR STRUCTURE AND FABRICATION METHOD THEREOF

CROSS-REFERENCE TO RELATED APPLICATION

This application claims the priority benefit of China application serial no. 201910948784.3, filed on Oct. 8, 2019. The entirety of the above-mentioned patent application is hereby incorporated by reference herein and made a part of this specification.

BACKGROUND

Field of the Invention

The invention relates to a semiconductor fabrication technique and more particularly, to a fin field effect transistor (FinFET) structure and a fabrication method thereof.

Description of Related Art

It is unavoidable for an integrated circuit (IC) to introduce a great amount of transistor elements. A size and performance of a final IC are decided by sizes and operation efficiencies of the transistors. Thus, designs of transistor structures have been also accordingly developed.

In the consideration from an aspect of reducing the transistor sizes, various new transistor structures have been provided for replacing the conventional transistor structures using large areas. Among them, a fin field effect transistor (FinFET) structure, or referred to as a fin transistor, has also been proposed, which can at least achieve effectively reducing the transistor sizes.

In a design with a device size that is dramatically reduced, for a general structure of a fin transistor, a distance between adjacent line-like fin structures is small. However, the isolation between the fin structures are based on a semiconductor fabrication technique that the isolation may be usually achieved by shallow trench isolation structures made of a dielectric material, such as oxide. As the distance between the fin structures is reduced, a parasitic capacitance therebetween is increased. The increase of the parasitic capacitance may enlarge a resistance-capacitance (RC) effect, such that an operating speed is reduced.

To reduce the parasitic capacitance between the fin structures, one of the methods is to fabricate the shallow trench isolation structures by using a dielectric material with a low dielectric constant. For a general dielectric material of oxide, its dielectric constant is still relatively high, which is no longer applicable.

Generally, the air has a dielectric constant close to 1 and is barely a material with the lowest dielectric constant. The so-called air dielectric material represents a free space. The air in a natural state substantially exists in the free space in a vacuum state and therefore, becomes air isolation structures.

Thus, how to form the air space to reduce the dielectric constant of the isolation structure to reduce the parasitic capacitance is one of the subjects for development.

SUMMARY

The invention relates to a fin transistor structure and a fabrication method thereof, which can incorporate air spaces into an isolation structure for isolating fin structures as a part of the isolation, thereby reducing an overall dielectric constant and reducing a parasitic capacitance.

In an embodiment, a fin transistor structure is provided. The fin transistor structure includes a first substrate. An insulation layer is disposed on the first substrate. A plurality of fin structures are disposed on the insulation layer. A supporting dielectric layer fixes the fin structures at waist parts of the fin structures. A gate structure layer is disposed on the supporting dielectric layer and covers a portion of the fin structures.

In an embodiment, for the fin transistor structure, the fin structures are a portion of a second substrate, and the second substrate is disposed on the insulation layer on the first substrate.

In an embodiment, for the fin transistor structure, the second substrate further has a bulk part surrounding the fin structures and an end part of the supporting dielectric layer is fixed to the bulk part of the second substrate.

In an embodiment, for the fin transistor structure, the insulation layer covers an end surface of the bulk part so as to be attached to the first substrate.

In an embodiment, for the fin transistor structure, the insulation layer covers a portion of side walls of the fin structures lower than the waist parts.

In an embodiment, for the fin transistor structure, each of the fin structures has a first end surface on the insulation layer and a second end surface which is opposite to the first end surface and covered by the gate structure layer, wherein the second end surface is wider than the first end surface along a cross-sectional direction with respect to the fin structures.

In an embodiment, for the fin transistor structure, a distance from the first substrate to the waist part of each of the fin structures is equal to or more than a half of a height of each of the fin structures.

In an embodiment, for the fin transistor structure, the insulation layer is an oxide layer, a nitride layer or a dielectric layer.

In an embodiment, for the fin transistor structure, a plurality of initial fin structures are disposed on an initial substrate, a fin spacing between the initial fin structures is predetermined, the initial fin structures are used as the fin structures, and a distance between two adjacent fin structures is equal to the fin spacing.

In an embodiment, for the fin transistor structure, a plurality of initial fin structures are disposed on an initial substrate, a fin spacing between the initial fin structures is predetermined, a portion of the initial fin structures are used as the fin structures, and a distance between two adjacent fin structures is at least a double of the fin spacing.

In an embodiment, a fabrication method of a fin transistor device is further provided. The method includes following steps. A first substrate is provided, wherein a plurality of fin structures are formed on the fin structure, a dielectric layer is filled between base parts of the fin structures, and an insulation layer is at least disposed on first end surfaces of the fin structures. The first end surfaces of the fin structures are disposed on a second substrate. The first substrate and the dielectric layer are polished to expose the fin structures. The fin structures are respectively formed as a plurality of units. A portion of the dielectric layer is removed, wherein a remaining portion of the dielectric layer is a supporting dielectric layer to fix the fin structures at waist parts of the fin structures. A gate structure layer is formed on the supporting dielectric layer and covering a portion of the fin structures.

In an embodiment, for the fabrication method of the fin transistor device, the fin structures are a portion of the first substrate, and the first substrate with the insulation layer is disposed on the second substrate.

In an embodiment, for the fabrication method of the fin transistor device, the second substrate further has a bulk part surrounding the fin structures and an end part of the supporting dielectric layer is fixed by a bulk part of the first substrate.

In an embodiment, for the fabrication method of the fin transistor device, the insulation layer covers an end surface of the bulk part so as to be attached to the first substrate.

In an embodiment, for the fabrication method of the fin transistor device, the insulation layer covers a portion of side walls of the fin structures lower than the waist parts.

In an embodiment, for the fabrication method of the fin transistor device, each of the fin structures has a first end surface on the insulation layer and a second end surface which is opposite to the first end surface and covered by the gate structure layer, wherein the second end surface is wider than the first end surface along a cross-sectional direction with respect to the fin structures.

In an embodiment, for the fabrication method of the fin transistor device, a distance from the first substrate to the waist part of each of the fin structures is equal to or more than a half of a height of each of the fin structures.

In an embodiment, for the fabrication method of the fin transistor device, the insulation layer is an oxide layer, a nitride layer or a dielectric layer.

In an embodiment, for the fabrication method of the fin transistor device, a plurality of initial fin structures are first formed for the first substrate, and the initial fin structures are used as the fin structures.

In an embodiment, for the fabrication method of the fin transistor device, a plurality of initial fin structures are first formed for the first substrate, a portion of the initial fin structures used as dummy fins are removed to form the fin structures.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The invention relates to a fin transistor structure and a fabrication method thereof. The invention proposes effectively incorporating air spaces into an isolation structure for isolating fin structures as a part of the isolation. A dielectric constant of a sir space is close to 1, and in this way, an overall dielectric constant may be effectively reduced, so as to at least reduce a parasitic capacitance.

Several embodiments are provided below for describing the invention, however, the invention is not limited to the provided embodiments, and moreover, the embodiments may also be allowed to be suitably combined.

Figure 1A:
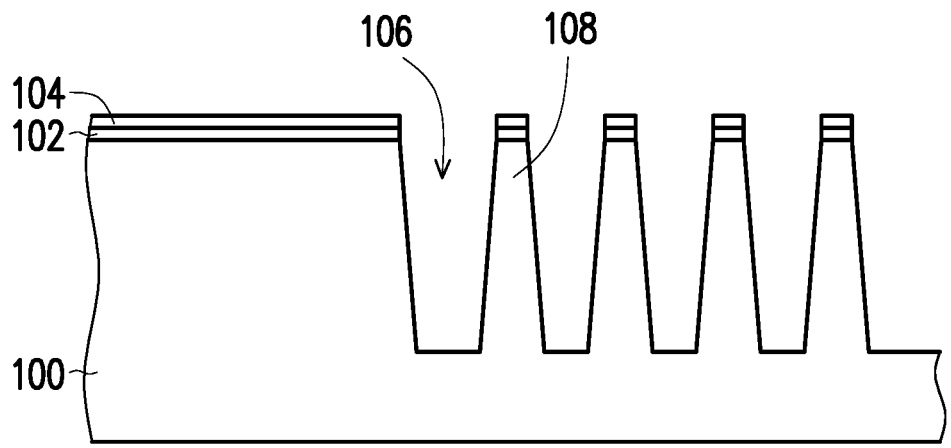
FIG. 1A through FIG. 1F are schematic cross-sectional views illustrating a fabrication process of a fin transistor device according to an embodiment of the invention.

FIG. 1A through FIG. 1F are schematic cross-sectional views illustrating a fabrication process of a fin transistor device according to an embodiment of the invention. Referring to FIG. 1A, a substrate 100 is provided to initially form fin structures 108 in a predetermined area. The substrate 100 is, for example, a silicon substrate. Before the fin structures 108 are formed, for example, an oxidation layer 102 and a nitride layer 104 are formed for a protecting the substrate 100 from being etched. In an embodiment, the substrate 100, the oxidation layer 102 and the nitride layer 104 define the substrate 100 through a lithography and etching process to remove a portion of the substrate 100 to form trenches 106. The substrate 100 between the trenches 106 forms initial fin structures 108. A width of each trench 106 between the fin structures 108 has a predetermined size. In an embodiment, the initial fin structures 108 are a part that is not removed. Thus, an isolation distance between two adjacent fin structures 108 is equal to the width of each trench 106.

Figure 1B:
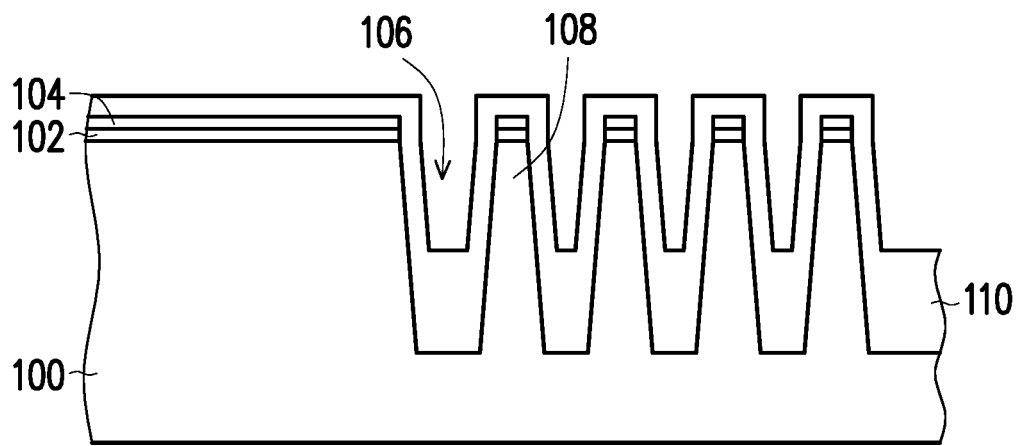

Referring to FIG. 1B, a dielectric layer 100 is deposited and disposed on the substrate 100. The dielectric layer 110 is, for example, an oxide layer. In an embodiment, the dielectric layer 110 covers the nitride layer 104 and is only filled in lower portions of the trenches 106, without being fully filled in the trenches 106.

Figure 1C:
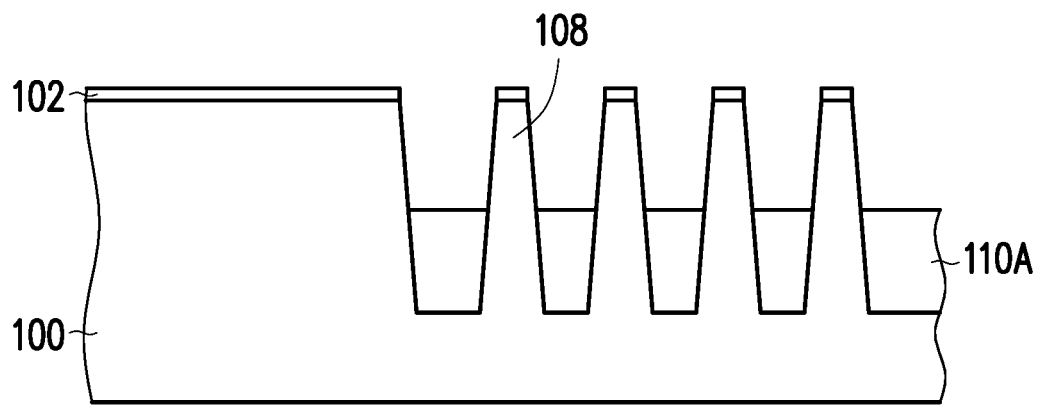

Referring to FIG. 1C, in an embodiment, a portion of the dielectric layer 110 is removed by an etching process. A remaining portion of the dielectric layer 110 becomes a dielectric layer 110A and is maintained in the lower portions of the trenches 106. In the meantime, the nitride layer 104 is also removed, but the oxidation layer 102 is retained and subsequently serves as an insulation layer. The oxidation layer 102 remains covering end surfaces of the fin structures 108. In this case, a width of the end surface covering the top of each fin structure 108 is greater than a width of the bottom of each fin structure 108.

Figure 1D:
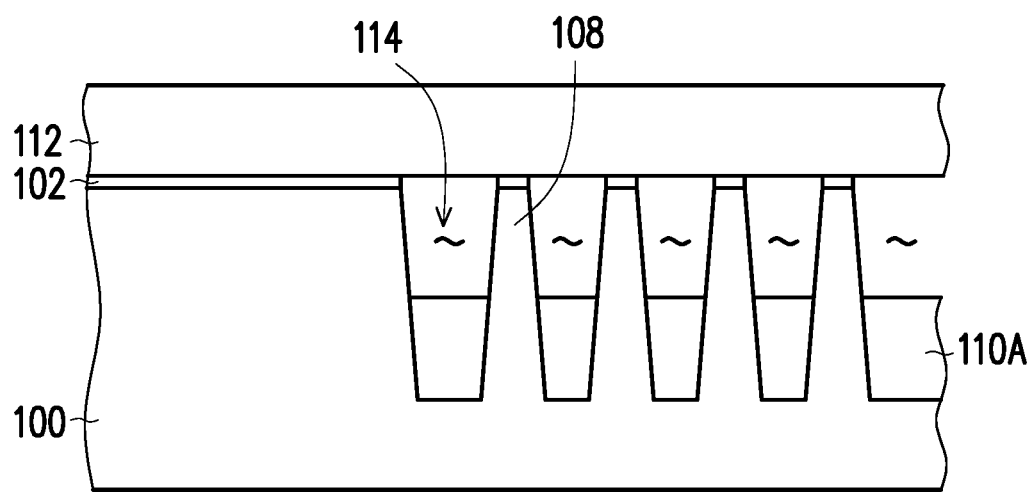

Referring to FIG. 1D, the substrate 100 is bonded to another substrate 112 through the oxidation layer 102. In this case, the substrate 112 may also be a silicon substrate or not a silicon substrate. The oxidation layer 102 serves as an insulation layer between the substrate 100 and the substrate 112. The oxidation layer 102 may also cover a bulk part of the substrate 100 which is between the substrate 100 and the substrate 112.

In this case, it should be noted that the partially filled trenches 106 are covered by the substrate 112 to form air spaces, namely, air isolation structures 114 are formed. The air spaces, according to a dielectric material thereof, are the air isolation structures 114 which have a dielectric constant close to 1.

Figure 1E:
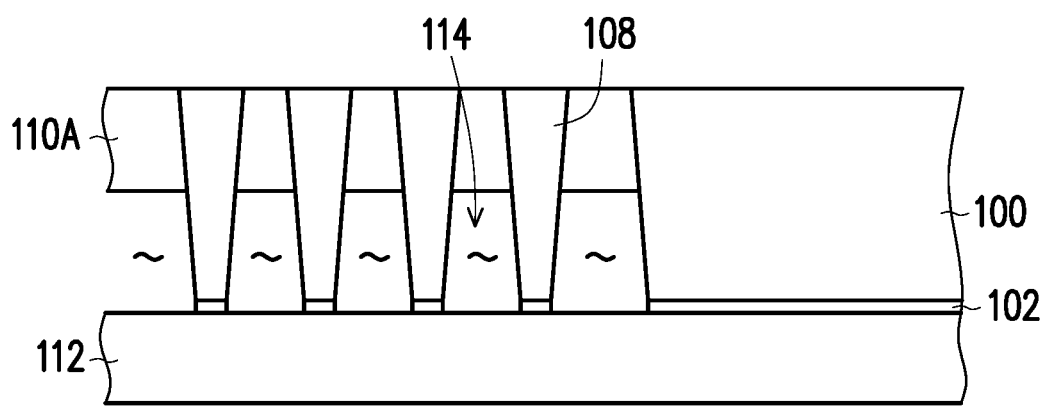

Referring to FIG. 1E, taking a state illustrated in FIG. 1D as an example, the substrate 100 may be interchanged with the substrate 112 in an embodiment, and in this way, a back surface of the substrate 100 is disposed above the overall structure. Then, a polishing process is performed on the back surface of the substrate 100 to remove a portion of the substrate 100 and expose the dielectric layer 110A and the other end surfaces of the fin structures 108.

Figure 1F:
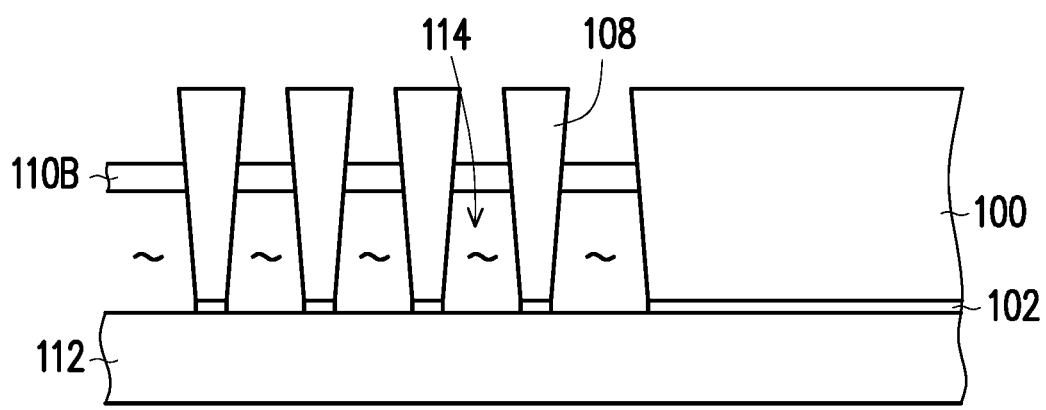

Referring to FIG. 1F, an etching process is performed on the dielectric layer 110A to remove a portion of the dielectric layer 110A. A remaining portion of the dielectric layer 110A forms a supporting dielectric layer 110B. An end part of the supporting dielectric layer 110B is fixedly attached to the substrate 100. The supporting dielectric layer 110B also simultaneously fixes a plurality of fin structures 108 and is located at waist parts of the fin structures 108. A location of the supporting dielectric layer 110B is relative to the waist parts of the fin structures 108, and a distance from the substrate 112 to each of the waist parts is, for example, equal to or more than a half of a height of the fin structures 108. A thickness of the fin structures 108 is not particularly limited as long as the strength produced by the thickness is capable of sufficiently supporting the fin structures 108.

In such a half-completed structure, the air isolation structures 114 are substantially formed for isolating the fin structures 108 from each other. A dielectric constant of the air isolation structures 114 is close to 1, which contributes to effectively reducing an overall dielectric constant, thereby reducing a parasitic capacitance.

In an embodiment, there are also different methods to form the air isolation structures 114, which are not limited to the embodiment illustrated in FIG. 1A through FIG. 1F. FIG. 2A through FIG. 2I are schematic cross-sectional views illustrating a fabrication process of a fin transistor device according to an embodiment of the invention.

Figure 2A:
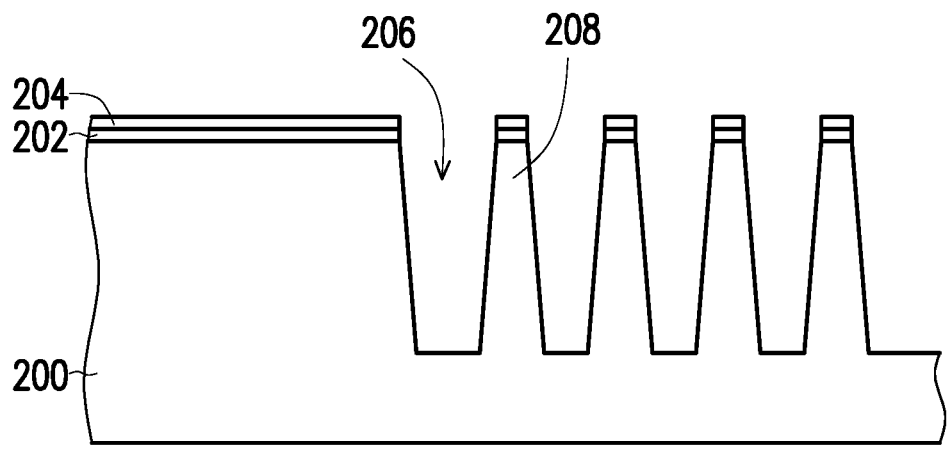
FIG. 2A through FIG. 2I are schematic cross-sectional views illustrating a fabrication process of a fin transistor device according to an embodiment of the invention.

Referring to FIG. 2A, at a beginning stage of manufacturing, similar to FIG. 1A, fin structures 208 are first formed on a substrate 200. An oxidation layer 202 and a nitride layer 204 also cover bulk parts of the substrate 200 and end surfaces of the fin structures 208. Trenches 206 are between the fin structures 208.

Figure 2B:
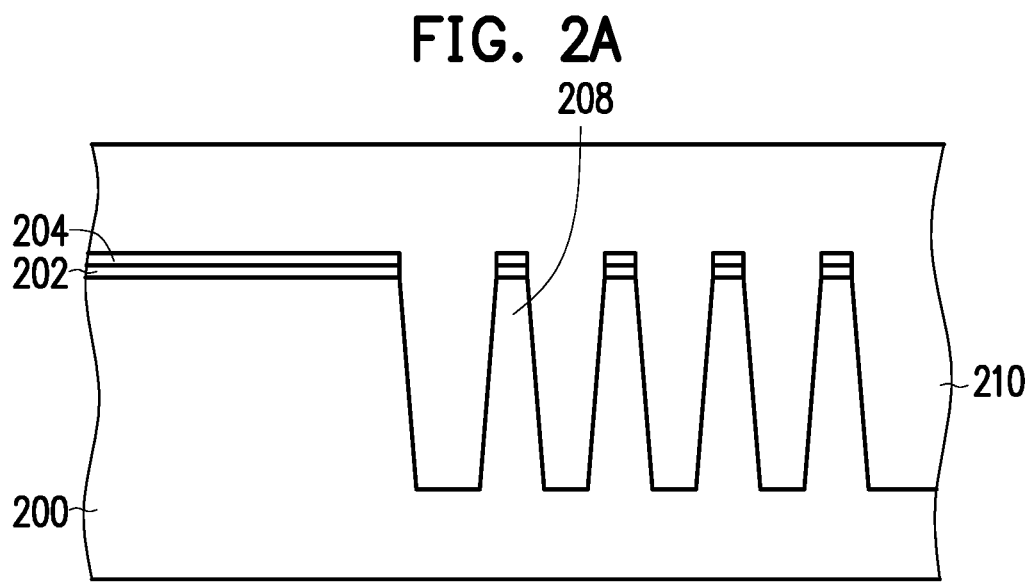
Figure 2C:
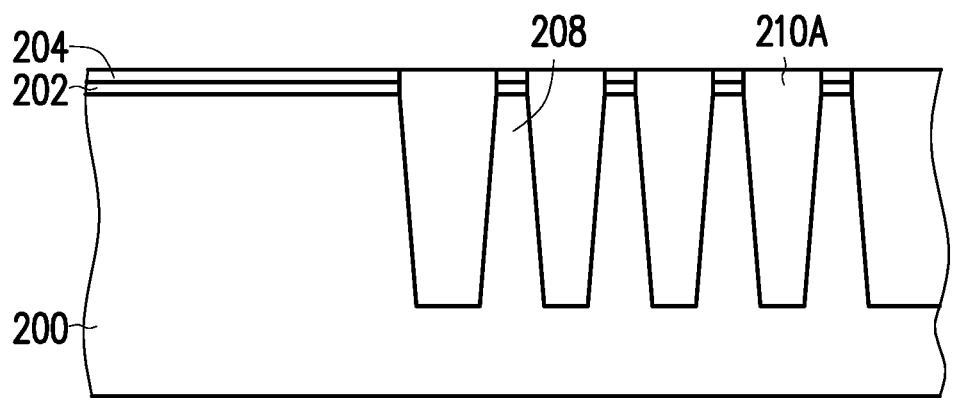

Referring to FIG. 2B, in an embodiment, a dielectric layer 210 is fully filled in all the trenches 206. Referring to FIG. 2C, a polishing process is first performed to remove an upper part of the dielectric layer 210 to expose the nitride layer 204. A remaining portion of the dielectric layer 210 is a dielectric layer 210A which is substantially filled in all the trenches 206.

Figure 2D:
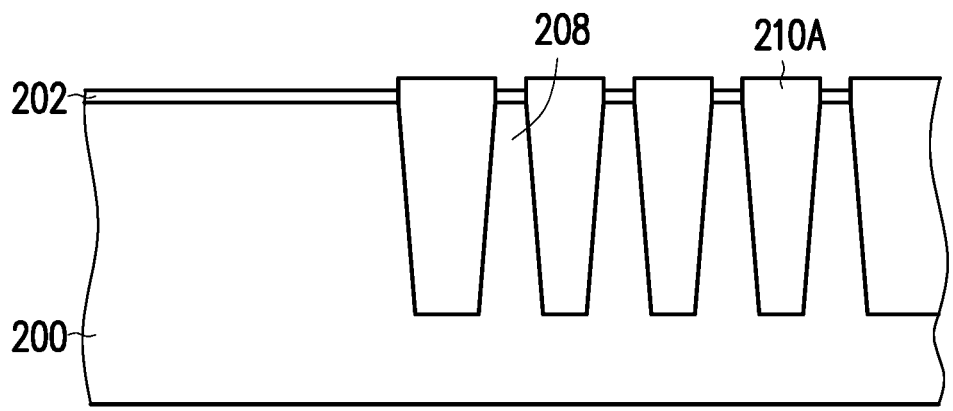
Figure 2E:
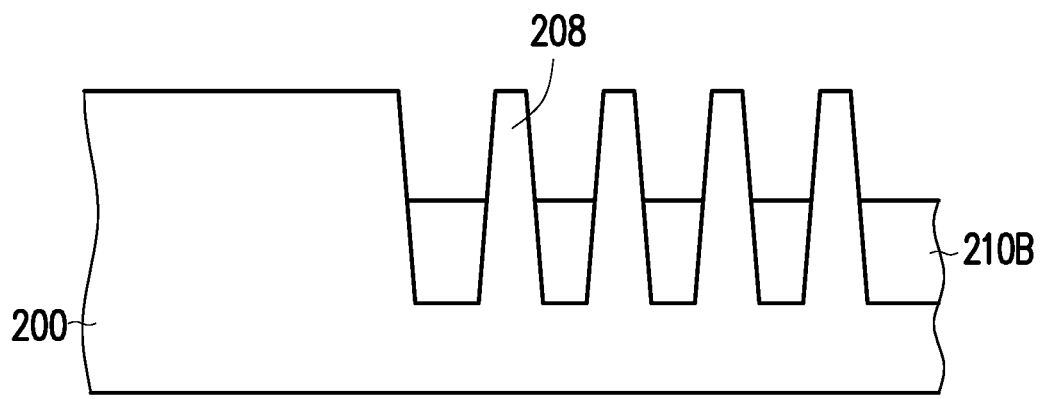

Referring to FIG. 2D, the nitride layer 204 is removed to expose the oxidation layer 202. Referring to FIG. 2E, an etching back process is performed to remove the oxide, and in this way, the upper part of the dielectric layer 210A is removed to obtain a dielectric layer 210B. In the meantime, the oxidation layer 200 is also removed to expose the substrate 200.

Figure 2F:
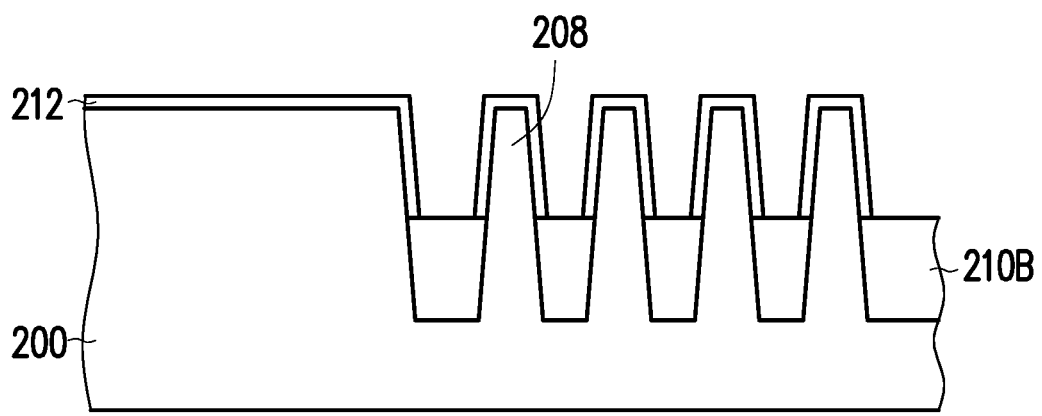

Referring to FIG. 2F, an insulation layer 212, which is an oxidation layer, for example, is again formed on an exposed surface of the substrate 200 by, for example, a thermal oxidation process. The insulation layer 212 is bonded to the dielectric layer 210B. The insulation layer 212 covers the exposed surface, including a part of a side wall and the end surface of each of the fin structures 208, as illustrated in FIG. 2E.

Figure 2G:
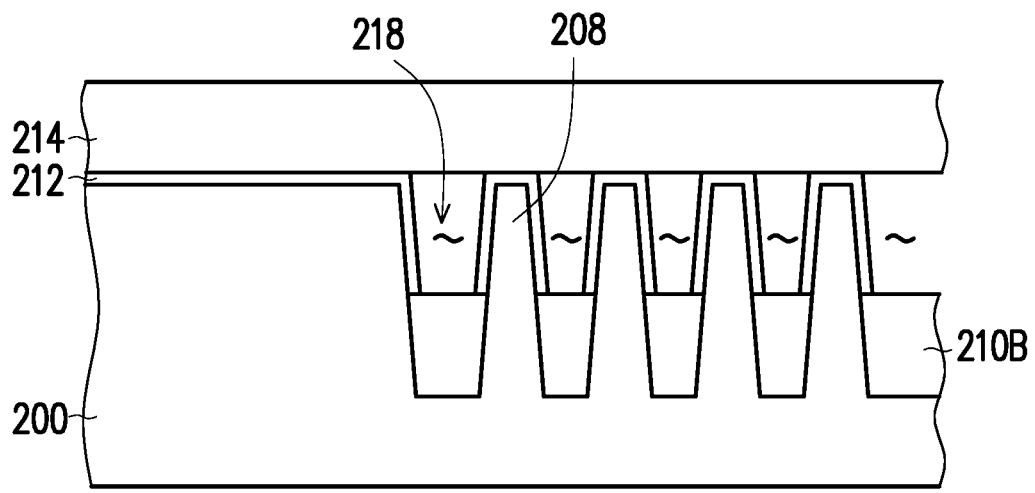

Referring to FIG. 2G another substrate 214 covers the substrate 200, namely, on the insulation layer 212. In this way, air isolation structures 218 are formed between the fin structures 208 for isolating the fin structures 208 from each other.

Figure 2H:
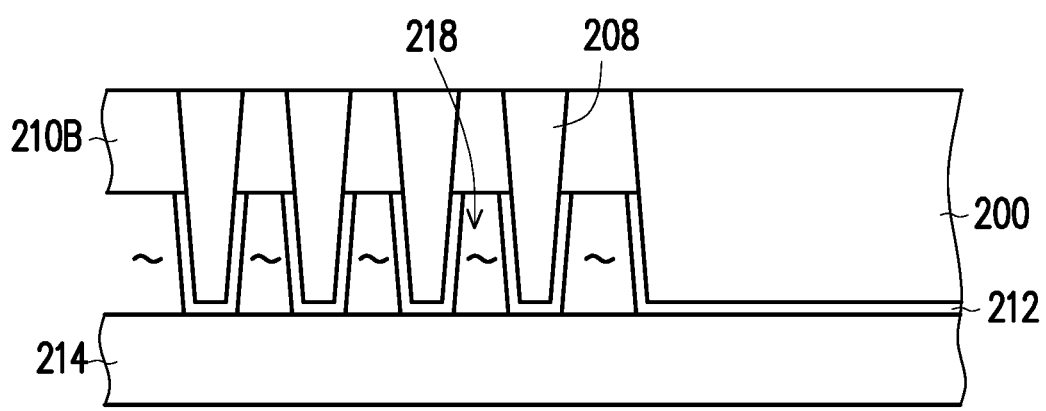

Referring to FIG. 2H, the substrate 214 is interchanged with the substrate 200, and thereby, the substrate 200 is disposed on the top of the structure, which is favorable for performing a polishing process. A portion of the substrate 200 is polished and removed by the polishing process to expose the dielectric layer 210B.

Figure 2I:
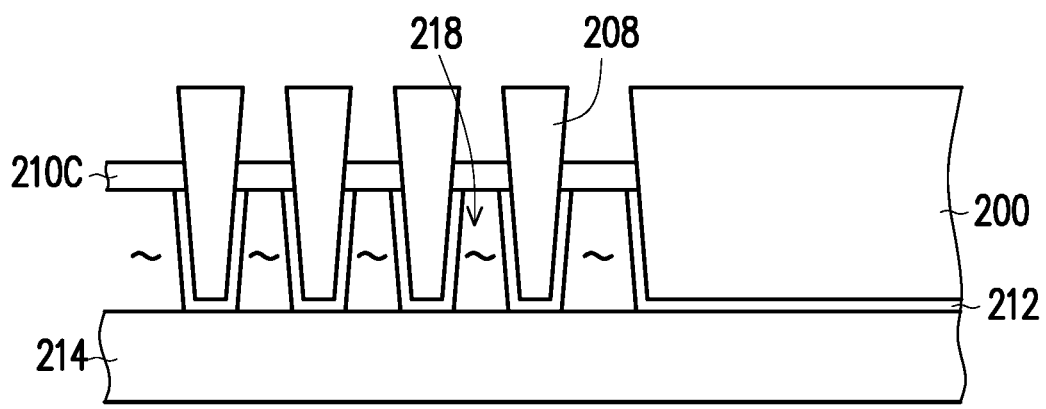

Referring to FIG. 2I, an oxide etching process is performed to remove a portion of the dielectric layer 210B, thereby reducing a thickness. The remaining dielectric layer 210B structurally forms a supporting dielectric layer 210C. The insulation layer 212 of the present embodiment simultaneously covers side walls of the fin structures 208 corresponding to the air isolation structures 218.

Figure 3:
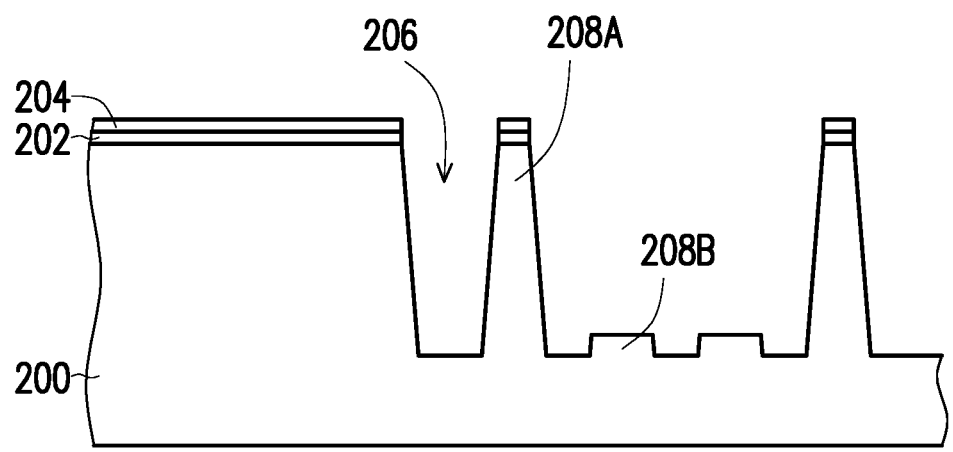
FIG. 3 is a schematic cross-sectional view illustrating fin structures in the fabrication of a fin transistor according to an embodiment of the invention.

One more embodiment is provided. FIG. 3 is a schematic cross-sectional view illustrating fin structures in the fabrication of a fin transistor according to an embodiment of the invention. Referring to FIG. 3, with respect to the initial fin structures 108 or 208 as illustrated in FIG. 1A or FIG. 2A, a part of the fin structures 108 or 208 may be made dummy. Taking the initial fin structures 208 illustrated in FIG. 2A for example, dummy fin structures 208B are removed to obtain actually desired fin structures 208A. In such a structure, a spacer between the fin structures 208A is greater than a fin spacing between the fin structures 208. In an ordinary condition, the spacer between the fin structures 208A is a double of the fin spacing between the fin structures 208 or more.

Figure 4:
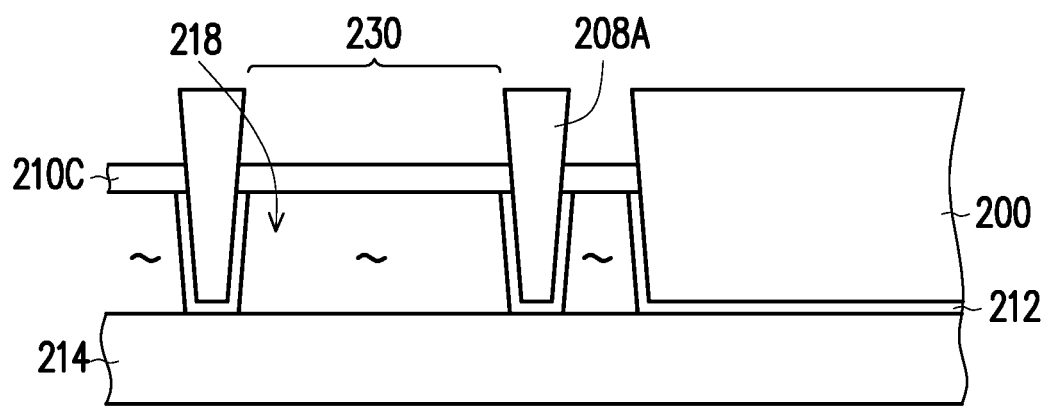
FIG. 4 is a schematic cross-sectional view illustrating fin structures in the fabrication of a fin transistor according to an embodiment of the invention.

FIG. 4 is a schematic cross-sectional view illustrating fin structures in the fabrication of a fin transistor according to an embodiment of the invention. Referring to FIG. 4, following the structure illustrated in FIG. 3, a structure similar to that illustrated in FIG. 2F may be obtained, for example, according to the fabrication process illustrated in FIG. 2B through FIG. 2I, however, a fin spacing 230 between the fin structures 208A is enlarged as the dummy fin structures 208B are removed.

Figure 5:
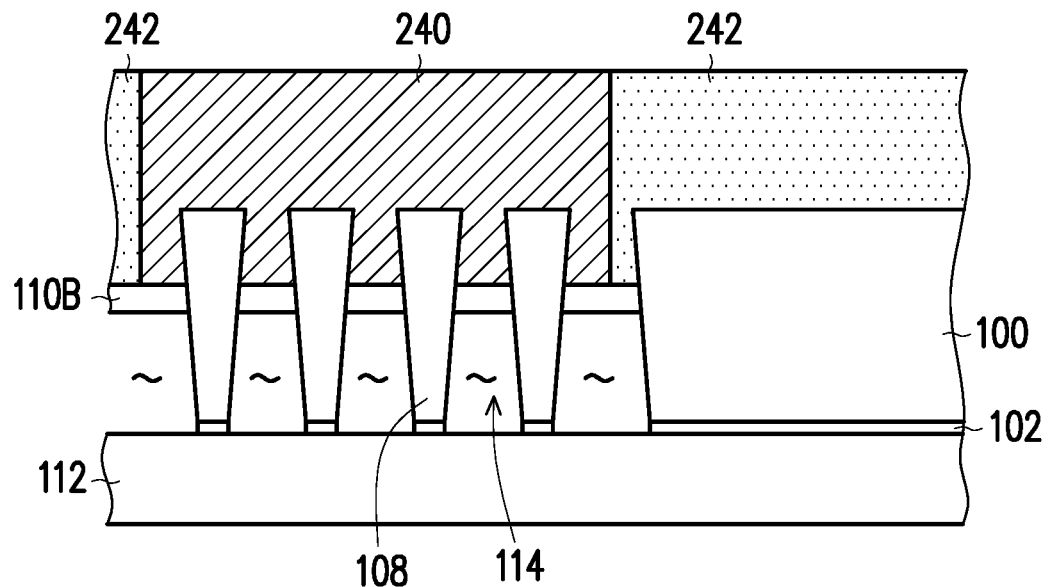
FIG. 5 is a schematic horizontally cross-sectional view illustrating a fin transistor according to an embodiment of the invention.

After the fin structures 108 or 208 and the air isolation structures 114 or 218 are completed, subsequent fabrication processes may be continued. FIG. 5 is a schematic horizontally cross-sectional view illustrating a fin transistor according to an embodiment of the invention.

Referring to FIG. 5, the structure illustrated in FIG. 1F is taken as an example in an embodiment, wherein an inter-layer dielectric 242 is formed to cover the substrate 100. Then, a gate structure layer 240 is formed in the inter-layer dielectric 242 to cover the exposed part of the fin structures 108. In this case, the gate structure layer 240 may generally include a gate layer and a gate insulation layer as commonly known, and detailed fabrication processes thereof are not described in detail hereinafter. The limitation is not intent to limit how the gate structure layer 240 is manufactured.

In may be noted herein that based on the fabrication flow of the invention, structurally, a width of the end surface of each of the fin structures 108 covered by the gate structure layer 240 is greater than a width of the end surface covered by the oxidation layer 102. A contact area between the gate structure layer 240 and the fin structures 108 may also be increased by the enlarged width, thereby increasing areas of a channel under the gate structure layer 240.

Figure 6:
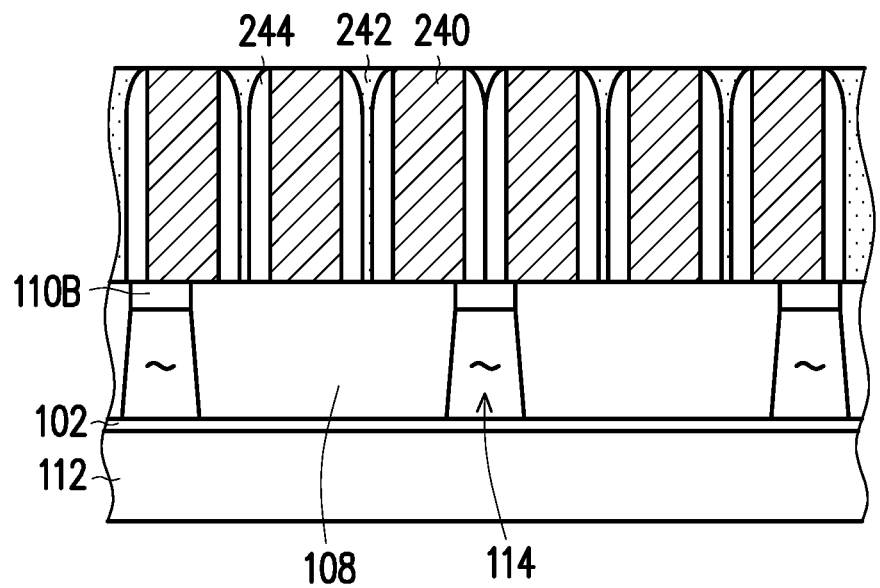
FIG. 6 is a schematic vertically cross-sectional view illustrating a fin transistor according to an embodiment of the invention.

FIG. 6 is a schematic vertically cross-sectional view illustrating a fin transistor according to an embodiment of the invention. Referring to FIG. 6, regarding a semiconductor structure of an overall circuit, it generally includes fin lines having a plurality of sections and extending along a vertical direction of the fin lines. The cross-sectional direction of FIG. 6 is perpendicular to the cross-sectional direction of FIG. 5, and each of line-like fin structures 108 having two sections is taken as an example. A plurality of gate structure layers 240 are disposed across each of the fin structures 108. The gate structure layers 240 also have a structure including gate lines disposed across each of the fin structures 108. Spacer walls 244 may also be formed on side walls of each of the gate structure layers 240. An inter-layer dielectric is filled between the spacer walls 244. Each of the air isolation structures 114 also exists between each adjacent fin structures 108.

The air isolation structures 114 provided by the invention are employed for isolating the fin structures 108 from each other, and in this way, the dielectric constant may be effectively reduced, so as to reduce the parasitic capacitance and enhance the efficiency of the fin transistor.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fin transistor structure, comprising:
   a first substrate;
   an insulation layer, disposed on the first substrate;
   a plurality of fin structures, disposed on the insulation layer;
   a supporting dielectric layer, fixing the fin structures at waist parts of the fin structures; and
   a gate structure layer, disposed on the supporting dielectric layer and covering a portion of the fin structures,
   wherein a part of each of the fin structures between the insulation layer and the supporting dielectric layer is exposed by an air space.

2. The fin transistor structure according to claim 1, wherein the fin structures are a portion of a second substrate, and the second substrate is disposed on the insulation layer on the first substrate.

3. The fin transistor structure according to claim 2, wherein the second substrate further has a bulk part surrounding the fin structures and an end part of the supporting dielectric layer is fixed to the bulk part of the second substrate.

4. The fin transistor structure according to claim 3, wherein the insulation layer covers an end surface of the bulk part so as to be attached to the first substrate.

5. The fin transistor structure according to claim 1, wherein the insulation layer covers a portion of side walls of the fin structures lower than the waist parts.

6. The fin transistor structure according to claim 1, wherein each of the fin structures has a first end surface on the insulation layer and a second end surface opposite to the first end surface and covered by the gate structure layer, wherein the second end surface is wider than the first end surface along a cross-sectional direction with respect to the fin structures.

7. The fin transistor structure according to claim 1, wherein a distance from the first substrate to the waist part of each of the fin structures is equal to or more than a half of a height of each of the fin structures.

8. The fin transistor structure according to claim 1, wherein the insulation layer is an oxide layer, a nitride layer or a dielectric layer.

* * * * *